(12) United States Patent
Kim

(10) Patent No.: US 7,576,560 B2
(45) Date of Patent: Aug. 18, 2009

(54) APPARATUS FOR MEASURING ON-DIE TERMINATION (ODT) RESISTANCE AND SEMICONDUCTOR MEMORY DEVICE HAVING THE SAME

(75) Inventor: Taek Seung Kim, Cheongiu-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/005,475

(22) Filed: Dec. 27, 2007

(65) Prior Publication Data

US 2008/0315913 A1    Dec. 25, 2008

(30) Foreign Application Priority Data

Jun. 25, 2007    (KR) .................. 10-2007-0062549

(51) Int. Cl.
*H03K 19/003* (2006.01)
(52) U.S. Cl. .......................... 326/30; 326/16
(58) Field of Classification Search ............. 326/30, 326/16
See application file for complete search history.

(56) References Cited

U.S. PATENT DOCUMENTS 6,909,305 B1 *    6/2005  Li et al. .................. 326/30
6,922,074 B2 *    7/2005  Coughlin et al. .......... 326/30
7,372,294 B2 *    5/2008  Kim ...................... 326/30
7,421,631 B2 *    9/2008  Morioka ................. 714/724

FOREIGN PATENT DOCUMENTS

KR    10-2007-0036552 A    4/2007

* cited by examiner

*Primary Examiner*—James Cho
(74) *Attorney, Agent, or Firm*—John P. White; Cooper & Dunham LLP

(57) ABSTRACT

An apparatus for measuring an on-die termination (ODT) resistance includes an ODT controller and a driver. The ODT controller receives a plurality of decoding signals, a first test mode signal, and a second test mode signal to generate a plurality of pull-up signals and a plurality of pull-down signals. The pull-up signals are enabled in response to the decoding signals and the first test mode signal, and the pull-down signals are enabled in response to the decoding signals and the second test mode signal. The driver receives the pull-up signals and the pull-down signals to drive a data terminal. At least one of the decoding signals is enabled by a mode register set (MRS) for setting an ODT mode.

20 Claims, 4 Drawing Sheets

APPARATUS FOR MEASURING ON-DIE TERMINATION (ODT) RESISTANCE AND SEMICONDUCTOR MEMORY DEVICE HAVING THE SAME

BACKGROUND

The present disclosure relates to a semiconductor memory device, and more particularly, to an apparatus for measuring an on-die termination (ODT) resistance, which can individually measure a resistance of a pull-up ODT unit and a resistance of a pull-down ODT in an ODT circuit and adjust them to the same value.

As the operating speed of semiconductor devices is increasing, a swing width of a signal interfaced between semiconductor devices is being gradually reduced for minimizing a delay time taken for signal transmission. However, due to the reduction in the swing width of the signal, the signal is greatly influenced by noise, causing impedance mismatching at an interface. The impedance mismatching may cause a difficulty in high-speed data transmission and distort output data. Since the impedance mismatching causes reflection of outgoing signals, there is a significant possibility that a transmission error will occur.

An impedance matching technology has been proposed which controls a resistance of a termination unit by adjusting the number of turned-on transistors among a plurality of transistors connected in parallel. This technology is called an on-chip termination or an on-die termination (ODT) and is applied to semiconductor memory devices of DDR-II or higher.

FIG. 1 illustrates a block diagram of a conventional ODT circuit.

Referring to FIG. 1, a pull-up/pull-down signal generator 1 generates first to n-th pull-up signals PU<1:n> and first to n-th pull-down signals PD<1:n>. When an ODT mode is set in a mode register set (MRS), at least one of the first to n-th pull-up signals PU<1:n> are enabled to a logic low level and at least one of the first to n-th pull-down signals PD<1:n> are enabled to a logic high level. At this point, the first pull-up signal PU<1> and the first pull-down signal PD<1> are simultaneously enabled, and the second pull-up signal PU<2> and the second pull-down signal PD<2> are simultaneously enabled. Likewise, the n-th pull-up signal PU<n> and the n-th pull-down signal PD<n> are simultaneously enabled.

First to n-th pull-up ODT units 2[1], 2[2], ..., 2[n] are implemented with PMOS transistors and resistors and receive the first to n-th pull-up signals PU<1:n> to pull up a DQ terminal. First to n-th pull-down ODT units 3[1], 3[2], ..., 3[n] are implemented with NMOS transistors and resistors and receive the first to n-th pull-down signals PD<1:n> to pull down the DQ terminal. Since the first pull-up signal PU<1> and the first pull-down signal PD<1> are simultaneously enabled, the first pull-up ODT unit 2[1] and the first pull-down OTD unit 3[1] are simultaneously turned on. Likewise, since the second pull-up signal PU<2> and the second pull-down signal PD<2> are simultaneously enabled, the second pull-up ODT unit 2[2] and the second pull-down ODT unit 3[2] are simultaneously turned on. Meanwhile, in order to make the signal outputted through the DQ terminal have half the power supply voltage (VDDQ), the resistance of the turned-on first pull-up ODT unit 2[1] and the resistance of the turned-on first pull-down ODT unit 3[1] must be equal to each other, and the resistance of the turned-on second pull-up ODT unit 2[2] and the resistance of the turned-on first pull-down ODT unit 3[2] must be equal to each other.

There is a need for improved ODT circuits.

BRIEF SUMMARY

This disclosure describes improved approaches for measuring an ODT resistance. In one embodiment, an apparatus for measuring an ODT resistance includes an ODT controller configured to receive a plurality of decoding signals, a first test mode signal, and a second test mode signal, and generate a plurality of pull-up signals and a plurality of pull-down signals, the pull-up signals being enabled in response to the decoding signals and the first test mode signal, the pull-down signals being enabled in response to the decoding signals and the second test mode signal, and a driver configured to receive the pull-up signals and the pull-down signals, and drive a data terminal.

At least one of the decoding signals may be enabled by a mode register set (MRS) for setting an ODT mode.

The ODT controller may include a first pull-up/pull-down signal generator configured to generate a first pull-up signal and a first pull-down signal, such that the first pull-up signal and the first pull-down signal are enabled in response to a first decoding signal when the first test mode signal and the second test mode signal are in a disabled state, the first pull-up signal is disabled when the first test mode signal is in an enabled state, and the first pull-down signal is disabled when the second test mode signal is in an enabled state, and a second pull-up/pull-down signal generator configured to generate a second pull-up signal and a second pull-down signal, such that the second pull-up signal and the second pull-down signal are enabled in response to a second decoding signal when the first test mode signal and the second test mode signal are in the disabled state, the second pull-up signal is disabled when the first test mode signal is in the enabled state, and the second pull-down signal is disabled when the second test mode signal is in the enabled state.

The first pull-up/pull-down signal generator may include a pull-up signal generating unit configured to perform a logic operation on the first decoding signal and an inversion signal of the first test mode signal to generate the first pull-up signal, and a pull-down signal generating unit configured to perform a logic operation on the first decoding signal and an inversion signal of the second test mode signal to generate the first pull-down signal.

The pull-up signal generating unit may be configured to perform a NAND operation and the pull-down signal generating unit may be configured to perform an AND operation.

The second pull-up/pull-down signal generator may include a pull-up signal generating unit configured to perform a logic operation on the second decoding signal and an inversion signal of the first test mode signal to generate the second pull-up signal, and a pull-down signal generating unit configured to perform a logic operation on the second decoding signal and an inversion signal of the second test mode signal to generate the second pull-down signal.

The driver may include a first pull-up unit configured to pull up the data terminal in response to the first pull-up signal, a first pull-down unit configured to pull down the data terminal in response to the first pull-down signal, a second pull-up unit configured to pull up the data terminal in response to the second pull-up signal, and a second pull-down unit configured to pull down the data terminal in response to the second pull-down signal.

The first pull-up unit may include a PMOS transistor and a resistor connected in series between a power supply voltage terminal and the data terminal, the PMOS transistor being turned on in response to the first pull-up signal.

The first pull-down unit may include an NMOS transistor and a resistor connected in series between the data terminal and a ground terminal, the NMOS transistor being turned on in response to the first pull-down signal.

The second pull-up unit may include a PMOS transistor and a resistor connected in series between a power supply voltage terminal and the data terminal, the PMOS transistor being turned on in response to the second pull-up signal.

The second pull-down unit may include an NMOS transistor and a resistor connected in series between the data terminal and a ground terminal, the NMOS transistor being turned on in response to the second pull-down signal.

In another embodiment, an apparatus for measuring an ODT resistance includes an ODT controller configured to output a driver control signal in response to a plurality of decoding signals and a test mode signal, and a driver configured to drive a data terminal in response to the driver control signal.

The ODT controller may be configured to generate the driver control signal disabled in response to an enabling of the test mode signal.

The driver may be configured to stop the driving operation when the driver control signal is disabled.

In still another embodiment, a semiconductor memory device having a plurality of DRAM cells, which are connected through data buses and data terminals, and on-die termination (ODT) resistances for impedance matching of the data terminals includes a decoder configured to decode a mode register set (MRS) signal and an address signal in an ODT mode to generate a plurality of decoding signals, a first test mode signal, and a second test mode signal, an ODT controller configured to receive the decoding signals, the first test mode signal, and the second test mode signal to generate a plurality of pull-up signals and a plurality of pull-down signals, the pull-up signals being enabled in response to the decoding signals and the first test mode signal, the pull-down signals being enabled in response to the decoding signals and the second test mode signal, and a driver configured to receive the pull-up signals and the pull-down signals to drive a data output terminal.

DESCRIPTION OF EXEMPLARY EMBODIMENTS

An apparatus for measuring an ODT resistance and a semiconductor memory device having the same in accordance with exemplary embodiments and examples of the present invention will be described hereinafter in detail with reference to the accompanying drawings.

Figure 1:
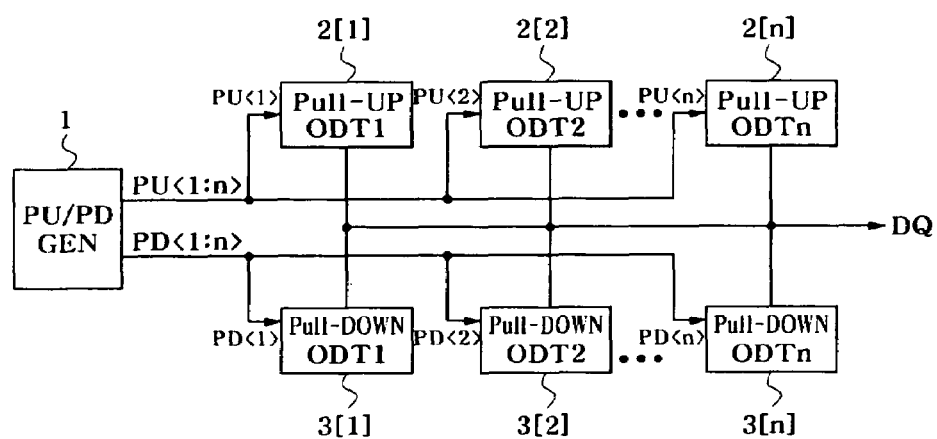
FIG. 1 illustrates a block diagram of a conventional ODT circuit.
Figure 2:
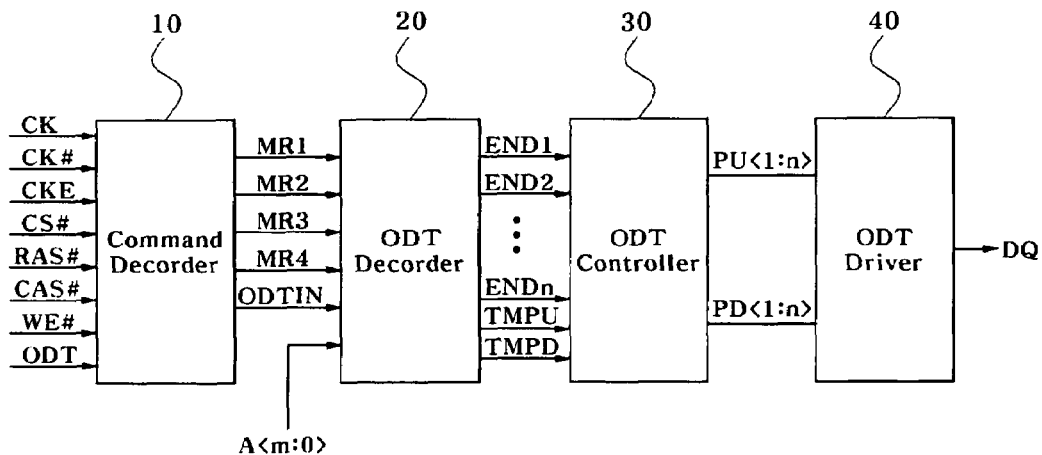
FIG. 2 illustrates a block diagram of an apparatus for measuring an ODT resistance, according to an exemplary embodiment of the present disclosure.
Figure 3:
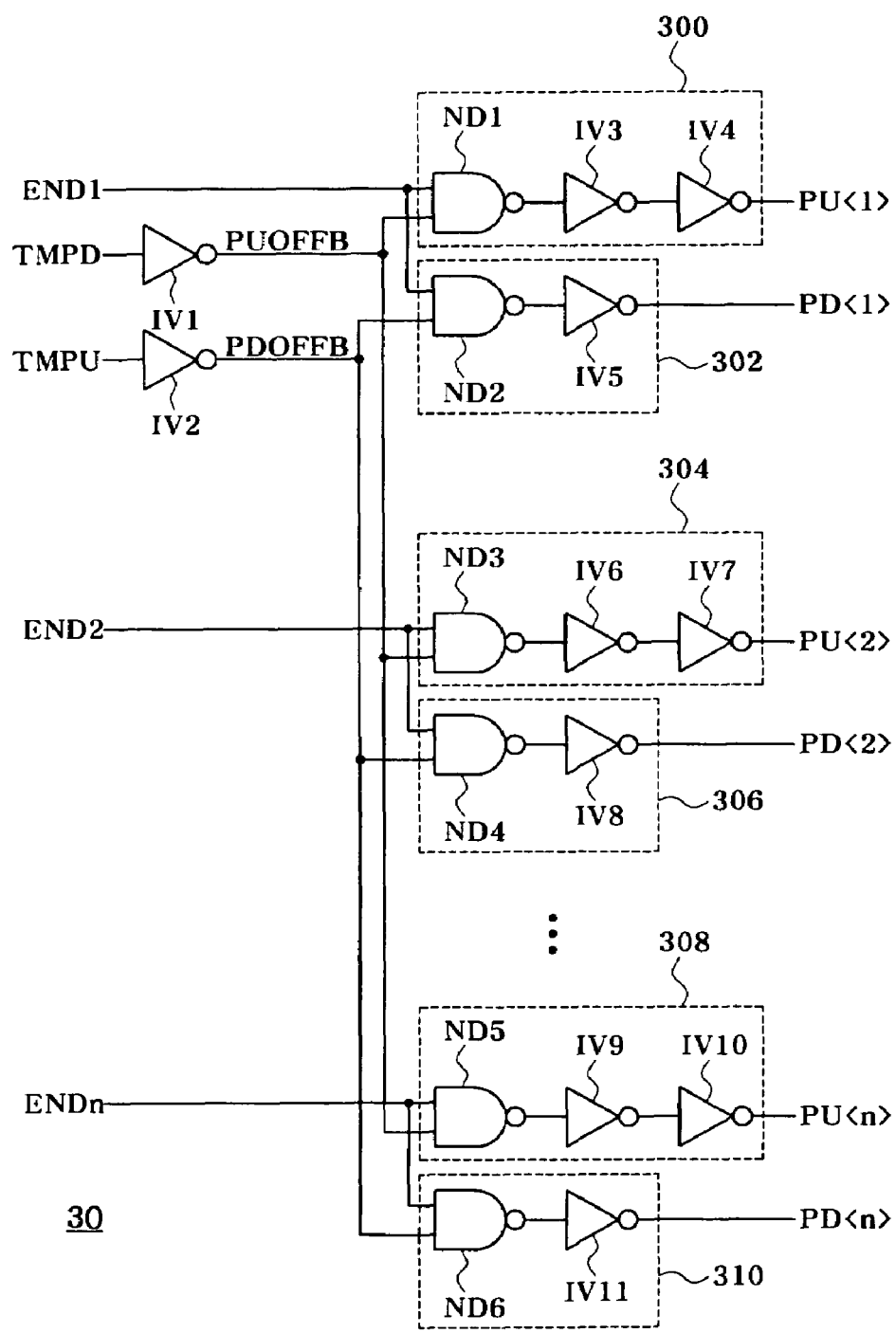
FIG. 3 illustrates a circuit diagram of an ODT controller of FIG. 2.
Figure 4:
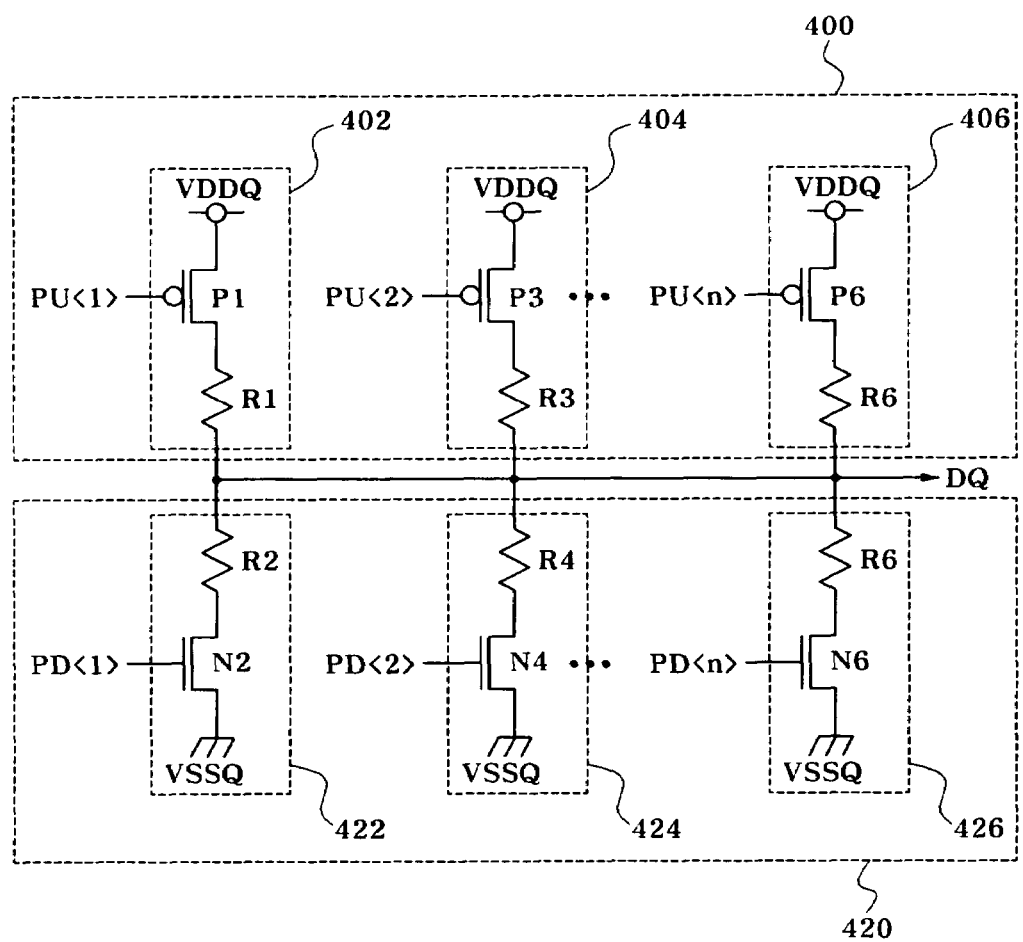
FIG. 4 illustrates a circuit diagram of an ODT driver of FIG. 2.

FIG. 2 illustrates a block diagram of an apparatus for measuring an ODT resistance according to an exemplary embodiment of the present disclosure, FIG. 3 illustrates a circuit diagram of an ODT controller of FIG. 2, and FIG. 4 illustrates a circuit diagram of an ODT driver of FIG. 2.

Referring to FIG. 2, the apparatus for measuring the ODT resistance includes a command decoder 10, an ODT decoder 20, an ODT controller 30, and an ODT driver 40.

The command decoder 10 receives external pin input signals CK, CK#, CKE, CS#, RAS#, CAS# and WE# and an ODT pin input signal ODT to generate command signals MR1 to MR4 and an ODT command signal ODTIN for executing an ODT mode according to an MRS. The command signals MR1 to MR4 and the ODT command signal ODTIN are set to predetermined levels specified in the specification for memory devices of DDR or higher.

The ODT decoder 20 receives the command signals MR1 to MR4, the ODT command signal ODTIN, and external address signals A<m:0>, and generates decoding signals END1 to ENDn, a first test mode signal TMPD, and a second test mode signal TMPU. The decoding signals END1 to ENDn, the first test mode signal TMPD, and the second test mode signal TMPU are generated while satisfying ODT values specified in the specification for memory devices of DDR or higher.

Referring to FIG. 3, the ODT controller 30 includes a first pull-up signal generating unit 300, a first pull-down signal generating unit 302, a second pull-up signal generating unit 304, a second pull-down signal generating unit 306, an n-th pull-up signal generating unit 308, and an n-th pull-down signal generating unit 310. The first pull-up signal generating unit 300 performs a NAND operation on the first decoding signal END1 and an inversion signal PUOFFB of the first test mode signal TMPD for stopping the pull-up driving of the ODT driver 40 and generates the first pull-up signal PU<1>. The first pull-down signal generating unit 302 performs an AND operation on the first decoding signal END1 and an inversion signal PDOFFB of the second test mode signal TMPU for stopping the pull-down driving of the ODT driver 40 and generates the first pull-down signal PD<1>. The second pull-up signal generating unit 304 performs a NAND operation on the second decoding signal END2 and the inversion signal PUOFFB of the first test mode signal TMPD and generates the second pull-up signal PU<2>. The second pull-down signal generating unit 306 performs an AND operation on the second decoding signal END2 and the inversion signal PDOFFB of the second test mode signal TMPU and generates the second pull-down signal PD<2>. The n-th pull-up signal generating unit 308 performs a NAND operation on the n-th decoding signal ENDn and the inversion signal PUOFFB of the first test mode signal TMPD and generates the n-th pull-up signal PU<n>. The n-th pull-down signal generating unit 310 performs an AND operation on the n-th decoding signal ENDn and the inversion signal PDOFFB of the second test mode signal TMPU and generates the n-th pull-down signal PD<n>.

Referring to FIG. 4, the ODT driver 40 includes a pull-up driving unit 400 and a pull-down driving unit 420. The pull-up driving unit 400 pulls up the DQ terminal in response to the first to n-th pull-up signals PU<1:n>, and the pull-down driving unit 420 pulls down the DQ terminal in response to the first to n-th pull-down signals PD<1:n>.

The pull-up driving unit 400 includes a first pull-up ODT unit 402, a second pull-up ODT unit 404, and an n-th pull-up ODT unit 406. The first pull-up ODT unit 402 is implemented with a PMOS transistor P1 and a resistor R1 connected in series between the power supply voltage terminal VDDQ and the DQ terminal. The second pull-up ODT unit 404 is implemented with a PMOS transistor P3 and a resistor R3 connected in series between the power supply voltage terminal VDDQ and the DQ terminal. The n-th pull-up ODT unit 406 is implemented with a PMOS transistor P6 and a resistor R6 connected in series between the power supply voltage terminal VDDQ and the DQ terminal. The PMOS transistor P1 is turned on in response to the first pull-up signal PU<1>, the PMOS transistor P3 is turned on in response to the second pull-up signal PU<2>, and the PMOS transistor P6 is turned on in response to the n-th pull-up signal PU<n>.

The pull-down driving unit 420 includes a first pull-down down ODT unit 422, a second pull-down ODT unit 424, and an n-th pull-down ODT unit 426. The first pull-down ODT unit 422 is implemented with an NMOS transistor N2 and a resistor R2 connected in series between the DQ terminal and the ground terminal VSSQ. The second pull-down ODT unit 424 is implemented with an NMOS transistor N4 and a resistor R4 connected in series between the DQ terminal and the ground terminal VSSQ. The n-th pull-down ODT unit 426 is implemented with an NMOS transistor N6 and a resistor R6 connected in series between the DQ terminal and the ground terminal VSSQ. The NMOS transistor N2 is turned on in response to the first pull-down signal PD<1>, the NMOS transistor N4 is turned on in response to the second pull-down signal PD<2>, and the NMOS transistor N6 is turned on in response to the n-th pull-down signal PD<n>.

An operation of the apparatus for measuring the ODT resistance will be described below with reference to FIGS. 2 to 4.

Referring to FIG. 2, the command decoder 10 receives the external pin input signals CK, CK#, CKE, CS#, RAS#, CAS# and WE# and the ODT pin input signal ODT, and generates the command signals MR1 to MR4 and the ODT command signal ODTIN according to the MRS. The command signals MR1 to MR4 and the ODT command signal ODTIN are set to predetermined levels specified in the specification for memory devices of DDR or higher.

The ODT decoder 20 receives the command signals MR1 to MR4, the ODT command signal ODTIN, and external address signals A<m:0>, and generates the first to n-th decoding signals END1 to ENDn, the first test mode signal TMPD, and the second test mode signal TMPU. The first to n-th decoding signals END1 to ENDn, the first test mode signal TMPD, and the second test mode signal TMPU are generated while satisfying ODT values specified in the specification for memory devices of DDR or higher. Although at least one of the first to n-th decoding signals END1 to ENDn is enabled to a logic high level, it can also be set to a desired level. The first test mode signal TMPD and the second test mode signal TMPU are determined by a combination of the external address signals A<m:0> in such a state that the enabling of the first to n-th decoding signals END1 to ENDn is determined by the MRS. For example, the semiconductor memory device enters into the test mode in response to the enabling of the external address signal A<7>, and the enabling of the various test mode signals including the first test mode signal TMPD and the second test mode signal TMPU is determined by a combination of the external address signals A<6:0>. The combination of the external address signals A<m:0> for generating the first test mode signal TMPD and the second test mode signal TMPU can be variably changed in other embodiments of the present invention.

Referring to FIG. 3, the ODT controller 30 receives the first to n-th decoding signals END1 to ENDn, the first test mode signal TMPD, and the second test mode signal TMPU, and generates the first to n-th pull-up signals PU<1:n> and the first to n-th pull-down signals PD<1:n>. The ODT mode and the test mode of the ODT controller 30 will be described below in more detail.

In the ODT mode, since the first test mode signal TMPD and the second test mode signal TMPU are at a logic low level, the NAND gates ND1 to ND6 of the ODT controller 30 act as inverters. Therefore, the first pull-up signal PU<1> has the same level as the inversion signal of the first decoding signal END 1, and the first pull-down signal PD<1> has the same level as the first decoding signal END1. The second pull-up signal PU<2> has the same level as the inversion signal of the second decoding signal END2, and the second pull-down signal PD<2> has the same level as the second decoding signal END2. The n-th pull-up signal PU<n> has the same level as the inversion signal of the n-th decoding signal ENDn, and the n-th pull-down signal PD<n> has the same level as the n-th decoding signal ENDn. That is, the levels of the first to n-th pull-up signals PU<1:n> and the levels of the first to n-th pull-down signals PD<1:n> are determined by the first to n-th decoding signals END1 to ENDn.

In the test mode, at least one of the first test mode signal TMPD and the second test mode signal TMPU becomes a logic high level. When the first test mode signal TMPD is a logic high level and the second test mode signal TMPU is a logic low level, the first to n-th pull-up signals PU<1:n> are disabled to a logic high level, and the first to n-th pull-down signals PD<1:n> have the same level as the first to n-th decoding signals END1 to ENDn.

When the first test mode signal TMPD is a logic low level and the second test mode signal TMPU is a logic high level, the first to n-th pull-up signals PU<1:n> have the same level as the inversion signals of the first to n-th decoding signals END1 to ENDn and the first to n-th pull-down signals PD<1:n> are disabled to a logic low level.

When both the first test mode signal TMPD and the second test mode signal TMPU are a logic high level, the first to n-th pull-up signals PU<1:n> are disabled to a logic high level and the first to n-th pull-down signals PD<1:n> are disabled to a logic low level.

In summary, the first test mode signal TMPD is a signal disabling the first to n-th pull-up signals PU<1:n>, and thus the resistances of only the turned-on pull-down ODT units in the pull-down driving unit 420 can be measured. The turning-on of the pull-down ODT units is determined by the levels of the first to n-th decoding signals END1 to ENDn. In addition, the second test mode signal TMPU is a signal disabling the first to n-th pull-down signals PD<1:n>, and thus the resistances of only the turned-on pull-up ODT units in the pull-up driving unit 400 can be measured. The turning-on of the pull-up ODT units is determined by the levels of the first to n-th decoding signals END1 to ENDn.

Referring to FIG. 4, the ODT driver 40 receives the first to n-th pull-up signals PU<1:n> and the first to n-th pull-down signals PD<1:n> to pull the DQ terminal up or down. The operation of the ODT driver 40 will be described below, assuming that the first decoding signal END1 is at a logic high level and the second to n-th decoding signals END2 to ENDn are at a logic low level.

In the ODT mode in which the first test mode signal TMPD and the second test mode signal TMPU are at a logic low level, the first pull-up signal PU<1> is enabled to a logic low level and the first pull-down signal PD<1> is enabled to a logic high level. The second to n-th pull-up signals PU<2:n> are disabled to a logic high level, and the second to n-th pull-down signals PD<2:n> are disabled to a logic low level. Therefore, the PMOS transistor P1 of the pull-up driving unit 400 and the NMOS transistor N2 of the pull-down driving unit 420 are turned on. At this point, the DQ terminal must have half the power supply voltage VDDQ. To this end, the sum of the turn-on resistance of the PMOS transistor P1 and the resistance of the resistor R1 must be equal to the sum of the turn-on resistance of the NMOS transistor N2 and the resistance of the resistor R2. That is, the turn-on resistance of the first pull-up ODT unit 402 must be equal to the turn-on resistance of the first pull-down ODT unit 422. However, since the first pull-up ODT unit 402 and the first pull-down ODT unit 422 are simultaneously turned on, the turn-on resistances of the first pull-up ODT unit 402 and the first pull-down ODT unit 422 cannot be individually measured.

In the test mode in which the first test mode signal TMPD is enabled to a logic high level, the first pull-up signal PU<1> is disabled to a logic high level by the first test mode signal TMPD of the logic high level, and the first pull-down signal PD<1> is enabled to a logic high level by the first decoding signal END1 of a logic high level. Therefore, the PMOS transistor P1 of the pull-up driving unit 400 is turned off and the NMOS transistor N2 of the pull-down driving unit 420 is turned on. Hence, when the first test mode signal TMPD is enabled, the pull-up driving unit 400 is turned off, regardless of the levels of the first to n-th decoding signals END1 to ENDn. Consequently, the turn-on resistance of the pull-down driving unit 420 can be separately measured. That is, the turn-on resistance of the first pull-down ODT unit 422 can be separately measured.

In the test mode in which the second test mode signal TMPU is enabled to a logic high level, the first pull-down signal PD<1> is disabled to a logic low level by the second test mode signal TMPU of the logic high level, and the first pull-up signal PU<1> is enabled to a logic low level by the first decoding signal END1 of a logic high level. Therefore, the PMOS transistor P1 of the pull-up driving unit 400 is turned on and the NMOS transistor N2 of the pull-down driving unit 420 is turned off. Hence, when the second test mode signal TMPU is enabled, the pull-down driving unit 420 is turned off, regardless of the levels of the first to n-th decoding signals END1 to ENDn. Consequently, the turn-on resistance of the pull-up driving unit 400 can be separately measured. That is, the turn-on resistance of the first pull-up ODT unit 402 can be separately measured.

In summary, the first test mode signal TMPD is a signal enabled for separately measuring the turn-on resistance of only the pull-down driving unit 420, and the second test mode signal TMPU is a signal enabled for separately measuring the turn-on resistance of only the pull-up driving unit 400. Therefore, the turn-on resistance of the first pull-down ODT unit 422 and the turn-on resistance of the first pull-up ODT unit 402 can be separately measured using the first test mode signal TMPD and the second test mode signal TMPU. The voltage of the DQ terminal can be driven to half the power supply voltage VDDQ by adjusting the turn-on resistances to the same level.

Figure 5:
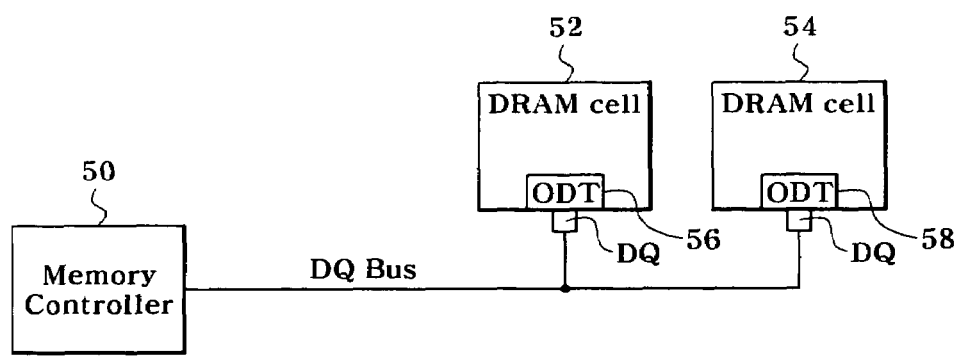
FIG. 5 illustrates a block diagram of a semiconductor memory device having the apparatus for measuring the ODT resistance, according to an exemplary embodiment of the present disclosure.

A semiconductor memory device including the apparatus for measuring the ODT resistance, according to an exemplary embodiment of the present disclosure, is illustrated in FIG. 5.

Referring to FIG. 5, DQ terminals of DRAM cells 52 and 54 are connected through DQ bus to a memory controller 50. The memory controller 50 transfers a control signal through the DQ bus to the DQ terminals of the DRAM cells 52 and 54. The ODT circuit sets the DQ terminal to half the power supply voltage VDDQ, thereby preventing the reflection of the control signal inputted from the memory controller 50. The ODT circuits applied to the semiconductor memory device receive the command signals MR1 to MR4, which are generated according to the MRS, and the first and second test mode signals TMPD and TMPU, which are enabled by the combination of the external address signals A<m:0>, and operate as the apparatus for measuring the ODT resistance, which can separately measure the turn-on resistance of the pull-up ODT unit and the turn-on resistance of the pull-down ODT unit. Since the apparatus for measuring the ODT resistance has been described above, its detailed description will be omitted for conciseness.

Although it has been described in the above exemplary embodiments and examples that the apparatus for measuring the ODT resistance is used to adjust the ODT resistance, it can also be applied to a variety of devices necessary to measure and adjust a resistance of each circuit element.

While the present invention has been described with respect to specific exemplary embodiments and examples, it will be apparent to those skilled in the art that various changes and modifications may be made without departing from the spirit and scope of the invention as defined in the following claims.

The present application claims priority to Korean patent application number 10-2007-0062549, filed on Jun. 25, 2007, which is incorporated by reference in its entirety.

What is claimed is:

1. An apparatus for measuring an on-die termination (ODT) resistance, comprising:
   an ODT controller configured to receive a plurality of decoding signals, a first test mode signal, and a second test mode signal, and generate a plurality of pull-up signals and a plurality of pull-down signals, the pull-up signals being enabled in response to the decoding signals and the first test mode signal, the pull-down signals being enabled in response to the decoding signals and the second test mode signal; and
   a driver configured to receive the pull-up signals and the pull-down signals, and drive a data terminal,
   wherein the ODT controller comprises:
   a first pull-up/pull-down signal generator configured to generate a first pull-up signal and a first pull-down signal, such that the first pull-up signal and the first pull-down signal are enabled in response to a first decoding signal when the first test mode signal and the second test mode signal are in a disabled state, the first pull-up signal is disabled when the first test mode signal is in an enabled state, and the first pull-down signal is disabled when the second test mode signal is in an enabled state; and
   a second pull-up/pull-down signal generator configured to generate a second pull-up signal and a second pull-down signal, such that the second pull-up signal and the second pull-down signal are enabled in response to a second decoding signal when the first test mode signal and the second test mode signal are in the disabled state, the second pull-up signal is disabled when the first test mode signal is in the enabled state, and the second pull-down signal is disabled when the second test mode signal is in the enabled state.

2. The apparatus of claim 1, wherein at least one of the decoding signals is enabled by a mode register set (MRS) for setting an ODT mode.

3. The apparatus of claim 1, wherein the first pull-up/pull-down signal generator comprises:
   a pull-up signal generating unit configured to perform a first logic operation on the first decoding signal and an inversion signal of the first test mode signal, to generate the first pull-up signal; and a pull-down signal generating unit configured to perform a second logic operation on the first decoding signal and an inversion signal of the second test mode signal, to generate the first pull-down signal.

4. The apparatus of claim 3, wherein the pull-up signal generating unit is configured to perform a NAND operation and the pull-down signal generating unit is configured to perform an AND operation.

5. The apparatus of claim 1, wherein the second pull-up/pull-down signal generator comprises:
a pull-up signal generating unit configured to perform a first logic operation on the second decoding signal and an inversion signal of the first test mode signal, to generate the second pull-up signal; and
a pull-down signal generating unit configured to perform a second logic operation on the second decoding signal and an inversion signal of the second test mode signal, to generate the second pull-down signal.

6. The apparatus of claim 1, wherein the driver comprises:
a first pull-up unit configured to pull up the data terminal in response to the first pull-up signal;
a first pull-down unit configured to pull down the data terminal in response to the first pull-down signal;
a second pull-up unit configured to pull up the data terminal in response to the second pull-up signal; and
a second pull-down unit configured to pull down the data terminal in response to the second pull-down signal.

7. The apparatus of claim 6, wherein the first pull-up unit comprises a PMOS transistor and a resistor connected in series between a power supply voltage terminal and the data terminal, the PMOS transistor being turned on in response to the first pull-up signal.

8. The apparatus of claim 6, wherein the first pull-down unit comprises an NMOS transistor and a resistor connected in series between the data terminal and a ground terminal, the NNOS transistor being turned on in response to the first pull-down signal.

9. The apparatus of claim 6, wherein the second pull-up unit comprises a PMOS transistor and a resistor connected in series between a power supply voltage terminal and the data terminal, the PMOS transistor being turned on in response to the second pull-up signal.

10. The apparatus of claim 6, wherein the second pull-down unit comprises an NMOS transistor and a resistor connected in series between the data terminal and a ground terminal, the NNOS transistor being turned on in response to the second pull-down signal.

11. A semiconductor memory device having a plurality of Memory cells, which are connected through data buses and data terminals, and on-die termination (ODT) resistors for impedance matching of the data terminals, the semiconductor memory device comprising:
a decoder configured to decode a mode register set (MRS) signal and an address signal in an ODT mode, and generate a plurality of decoding signals, a first test mode signal, and a second test mode signal;
an ODT controller configured to receive the decoding signals, the first test mode signal, and the second test mode signal, and generate a plurality of pull-up signals and a plurality of pull-down signals, the pull-up signals being enabled in response to the decoding signals and the first test mode signal, the pull-down signals being enabled in response to the decoding signals and the second test mode signal; and
a driver configured to receive the pull-up signals and the pull-down signals, and drive a data output terminal,
wherein the ODT controller comprises:

a first pull-up/pull-down signal generator configured to generate a first pull-up signal and a first pull-down signal, such that the first pull-up signal and the first pull-down signal are enabled in response to a first decoding signal when the first test mode signal and the second test mode signal are in a disabled state, the first pull-up signal is disabled when the first test mode signal is in an enabled state, and the first pull-down signal is disabled when the second test mode signal is in an enabled state; and
a second pull-up/pull-down signal generator configured to generate a second pull-up signal and a second pull-down signal, such that the second pull-up signal and the second pull-down signal are enabled in response to a second decoding signal when the first test mode signal and the second test mode signal are in the disabled state, the second pull-up signal is disabled when the first test mode signal is in the enabled state, and the second pull-down signal is disabled when the second test mode signal is in the enabled state.

12. The semiconductor memory device of claim 11, wherein at least one of the decoding signals is enabled by a mode register set (MRS) for setting the ODT mode.

13. The semiconductor memory device of claim 11, wherein the first pull-up/pull-down signal generator comprises:
a pull-up signal generating unit configured to perform a first logic operation on the first decoding signal and an inversion signal of the first test mode signal, and generate the first pull-up signal; and
a pull-down signal generating unit configured to perform a second logic operation on the first decoding signal and an inversion signal of the second test mode signal, and generate the first pull-down signal.

14. The semiconductor memory device of claim 13, wherein the pull-up signal generating unit is configured to perform a NAND operation and the pull-down signal generating unit is configured to perform an AND operation.

15. The semiconductor memory device of claim 11, wherein the second pull-up/pull-down signal generator comprises:
a pull-up signal generating unit configured to perform a first logic operation on the second decoding signal and an inversion signal of the first test mode signal, and generate the second pull-up signal; and
a pull-down signal generating unit configured to perform a second logic operation on the second decoding signal and an inversion signal of the second test mode signal, and generate the second pull-down signal.

16. The semiconductor memory device of claim 11, wherein the driver comprises:
a first pull-up unit configured to pull up the data terminal in response to the first pull-up signal;
a first pull-down unit configured to pull down the data terminal in response to the first pull-down signal;
a second pull-up unit configured to pull up the data terminal in response to the second pull-up signal; and
a second pull-down unit configured to pull down the data terminal in response to the second pull-down signal.

17. The semiconductor memory device of claim 16, wherein the first pull-up unit comprises a PMOS transistor and a resistor connected in series between a power supply voltage terminal and the data terminal, the PMOS transistor being turned on in response to the first pull-up signal.

18. The semiconductor memory device of claim 16, wherein the first pull-down unit comprises an NNOS transistor and a resistor connected in series between the data terminal and a ground terminal, the NMOS transistor being turned on in response to the first pull-down signal.

19. The semiconductor memory device of claim 16, wherein the second pull-up unit comprises a PMOS transistor and a resistor connected in series between a power supply voltage terminal and the data terminal, the PMOS transistor being turned on in response to the second pull-up signal.

20. The semiconductor memory device of claim 16, wherein the second pull-down unit comprises an NMOS transistor and a resistor connected in series between the data terminal and a ground terminal, the NMOS transistor being turned on in response to the second pull-down signal.

* * * * *